(12) United States Patent
Eriksen

(10) Patent No.: US 7,479,301 B2
(45) Date of Patent: Jan. 20, 2009

(54) METHOD FOR MODIFYING A METALLIC SURFACE

(75) Inventor: Soeren Eriksen, Roskilde (DK)

(73) Assignee: Danfoss A/S, Nordborg (DK)

( * ) Notice: Subject to any disclaimer, the term of this patent is extended or adjusted under 35 U.S.C. 154(b) by 629 days.

(21) Appl. No.: 10/512,922

(22) PCT Filed: May 1, 2002

(86) PCT No.: PCT/DK02/00280

§ 371 (c)(1),
(2), (4) Date: Oct. 29, 2004

(87) PCT Pub. No.: WO03/093530

PCT Pub. Date: Nov. 13, 2003

(65) Prior Publication Data

US 2005/0170088 A1    Aug. 4, 2005

(51) Int. Cl.
*C23C 16/06* (2006.01)
(52) U.S. Cl. .................................. 427/248.1
(58) Field of Classification Search .............. 427/248.1, 427/253, 255.39, 250, 255.28, 2.24
See application file for complete search history.

(56) References Cited

U.S. PATENT DOCUMENTS

| | | | |
|---|---|---|---|
| 3,366,520 A | 1/1968 | Berkenblit et al. | |
| 3,393,103 A | 7/1968 | Hellbardt et al. | |
| 3,480,491 A * | 11/1969 | Reisman et al. | 438/706 |
| 3,767,456 A | 10/1973 | Glaski | |
| 4,790,851 A * | 12/1988 | Suire et al. | 128/898 |
| 5,169,685 A * | 12/1992 | Woodruff et al. | 427/250 |
| 5,223,085 A | 6/1993 | Kawai et al. | |
| 5,356,474 A | 10/1994 | Savkar | |
| 6,121,152 A * | 9/2000 | Adams et al. | 438/697 |
| 6,136,213 A | 10/2000 | Shinozuka et al. | |
| 2002/0013051 A1 | 1/2002 | Hautala et al. | |
| 2003/0073304 A1 * | 4/2003 | Mak et al. | 438/643 |

FOREIGN PATENT DOCUMENTS

RU    2141005    11/1999

* cited by examiner

*Primary Examiner*—Timothy H Meeks
*Assistant Examiner*—Elizabeth A Burkhart
(74) *Attorney, Agent, or Firm*—McCormick, Paulding & Huber LLP

(57) ABSTRACT

The invention relates to a method for modifying a metallic surface, which method comprises chemical vapour deposition on a substrate in a chamber adapted for CVD and involves at least the step of interrupting the chemical vapour deposition by cutting off the flow of reactant gas, and where the substrate and the metallic surface form a part of a completed member and that this member during or after the interruption is subjected to a polishing of the metallic surface after depositing at least a part of the depositing metallic compound.

24 Claims, 4 Drawing Sheets

2

METHOD FOR MODIFYING A METALLIC SURFACE

CROSS-REFERENCE TO RELATED APPLICATIONS

This application is entitled to the benefit of and incorporates by reference essential subject matter disclosed in International Patent Application No. PCT/DK02/00280 filed on May 1, 2002.

FIELD OF THE INVENTION

The present invention relates to a method for modifying a metallic surface, the method comprising chemical vapour deposition on a substrate in a chamber adapted for CVD involving at least the steps of:

subjecting the substrate to chemical vapour deposition with a flow of reactant gas comprising a metal compound to be incorporated in the metal surface; and interrupting the chemical vapour deposition by cutting off the flow of reactant gas.

BACKGROUND OF THE INVENTION

Such a method involving interrupting a CVD process has been described in an article disclosing preparation of tantalum based alloys by a CVD process. In order to achieve compositional uniformity of the alloys a pulsed process is used. One pulse consists of chemical vapour deposition for 23 seconds and evacuation of the CVD chamber for 7 seconds. The metals are deposited on a substrate during the pulsed CVD process. The substrate is subsequently removed from the CVD prepared alloy (Preparation of tantalum-based alloys by a unique CVD process; W. A. Bryant and G. H. Meier; CVD—$5^{th}$. International Conf. 1975).

Coating techniques involving chemical vapour deposition are used increasingly due to the good properties, which can be achieved by this technique. The coating can be made with very small thickness and to cover the whole surface of a treated item with a uniform layer.

A chemical vapour deposition process is e.g. disclosed in US 2002013051. The document discloses formation on a substrate of tantalum and tantalum nitride films from tantalum halide precursors.

U.S. Pat. No. 3,393,103 discloses a modification of a surface on a single crystal by gas polishing. The method does not relate to chemical vapour deposition. The disclosed method is a specific method for polishing gallium arsenide single crystals.

Although a CVD process can achieve good results for the properties of the coating layer, it is however in some cases necessary to subject the resulting coating to a further treatment in order to obtain desired properties. For some purposes, e.g. medical purposes, the resulting coating need to be relatively smooth. Such smooth surfaces cannot be achieved by the chemical vapour deposition alone. Consequently a further treatment in order to modify the metallic surface is required. The further treatment is commonly a polishing of the metallic surface, e.g. by electro polishing or mechanical polishing. Thus the item to be polished has to be moved from the CVD chamber to another process equipment. This is of course time consuming and increases the production costs.

The object of the present invention is to provide a method for modifying a surface of a metallic layer deposited on the substrate in a CVD chamber.

SUMMARY OF THE INVENTION

The invention provides a method for modifying a surface formed by chemical vapour deposition on a substrate to obtain a smooth diffusion tight surface. The modified surface can function as a barrier between the substrate and the environment. The invention provides the advantage that depositing a metallic layer on a substrate by CVD and subsequent modifying the metallic layer can be combined in the same equipment. Moreover modifying a surface formed by chemical vapour deposition, e.g. by polishing can be fully integrated in a CVD process. Furthermore the method results in a smooth and dense nonporous surface.

The method for modifying a metallic surface according to the invention, comprises chemical vapour deposition on a substrate in a chamber adapted for CVD and involves at least the following steps:

1) subject the substrate to chemical vapour deposition with a flow of reactant gas comprising a compound of the metal to be deposited on the metal surface; and 2) interrupt the chemical vapour deposition by cutting off the flow of reactant gas, wherein the substrate and the metallic surface form a part of a completed member and that the member during or after the interruption is subjected to a polishing of the metallic surface after depositing at least a part of the depositing metallic compound.

It has been discovered that the pause caused by the interruption in step 2 can effect small unevenness and pinholes that appears in the metallic layer when this is formed on the surface of the substrate during step 1 in such a way that these unevenness and pinholes substantially are eliminated. Moreover the polishing provides a smooth even surface. Consequently a substrate with a smooth diffusion tight coating is obtained.

The term substrate encompasses any item suitable for receiving a coating of metal in a CVD process, i.e. the substrate must be able to tolerate the process conditions, such as temperature and pressure. The substrate may be a metal, an alloy or ceramic, glass or composite material, optionally the substrate is made from titanium or vitallium®. The substrate may have any desired shape, including complex shapes such as the shapes of various implants.

The completed member is constituted by the substrate and the metallic layer deposited on the substrate.

The reactant gas or precursor is a gas suitable for CVD and comprising a metal compound, and preferable the reactant gas comprises a metal halide e.g. a metal chloride. The reactant gas in a CVD process always comprises a reducing gas e.g. hydrogen. The reducing gas serves to reduce the metal in the metal compound to free metal, which deposit on the metallic surface on the substrate.

The interruption of the deposition may preferably be executed by cutting off the flow of reactant gas or precursor. Another way of cutting off would be to bypass the flow. A non-binding theory of the mechanism that appears during the interruption or pause is that a certain crystal growth of the crystals in the metallic surface of the deposition takes places, and that the crystal growth is orientated in such a way that it grows into and close pinholes or micropores in the surface, and consequently contribute to obtain a non-porous diffusion tight surface.

In a preferred embodiment according to the invention the deposition is interrupted for predetermined time of at least 15 seconds, and preferably between 30 and 600 seconds. If the pause caused by the interruption is shorter than 15 seconds, substantially no effect on the surface of the metallic layer can be detected. If the pause is between 30 and 600 seconds a desired effect on the metallic surface is detected. If the pause exceeds 600 second substantially no further effect is detected.

To obtain the best conditions for the processes it is preferred that the pressure in the chamber is reduced to be between 0.01 to 0.5 bar. Hereby other gas that may contaminate the metallic surface is substantially evacuated from the chamber.

Preferably the temperature in the chamber during the process is between 400 and 1250° C., more preferably between 500 and 1100° C., and even more preferably between 700 and 1000° C. At these temperatures the processes take place with a satisfactory high rate. If the temperature is decreased the process rate will be slower and if the temperature is increased the process rate will also increase. If the temperature is high there is a risk that the process will be difficult to control. Between 400 and 1250° C. the process runs satisfactory and between 500 and 1100° C. the process runs better and is easier to control. With regard to energy consumption and time required the process is optimally executed between 700 and 1000° C.

According to the invention the metallic surface is subjected to a polishing and preferably a polishing by gas. Gas polishing is advantageously as it may be performed in the CVD chamber, thus there will be no need for transferring the completed member to an external polishing site. Further, polishing with gas makes fine-tuning possible. Compared to conventional polishing techniques gas polishing allows removal of just the quantity of surface material needed to get a smooth surface. Especially where the expensive tantalum is used, material saving gas polishing is of interest.

It is preferred that the gas includes a flow of reactive gas comprising halogen or hydrogen halide and that the halogen or hydrogen halide in the reactive gas is selected from the group consisting of $F_2$, $Cl_2$, $Br_2$, $I_2$, HF, HCl, HBr and HI, which poses good polishing properties. Alternatively the polishing gas may be a gas comprising a metal halide corresponding to the metal compound in the precursor or the metal in the metallic surface, e.g. $TaCl_5$ for polishing a metallic surface of tantalum. In this case no reducing gas is supplied to the CVD chamber and the gaseous metal halide serves as polishing gas.

Preferably the polishing gas further comprises argon, hydrogen, helium or nitrogen. In principal those gases are inert in the process, however they may contribute to control the diffusion rates in the gaseous medium in the chamber, by a sort of "thickening" the gaseous medium. By controlling the diffusion rates in the process it is possible to ensure that only the tops of uneven parts or nodules is removed thereby providing a smoother surface.

According to the invention it is preferred that the flow of halogen is between 0.01 to 1.0 mol/h per liter reaction volume of the chamber. Moreover it is preferred that the flow of argon, hydrogen, helium or nitrogen is between 0.02 to 200 mol/h per liter reaction volume of the chamber. At these flow rates optimal conditions for diffusion rates of the involved compounds appears. The actual flow of the gases is dependant on the specific metallic surface to be polished by the gas and can be determined by the skilled person on the basis of routine experiments.

In the method it is preferred that the gaseous reaction product is simultaneously removed from the chamber in order to maintain a satisfactory reaction rate and avoid any unnecessary contamination.

In an example wherein the metallic surface layer is tantalum Ta the reactions in the polishing processes is when the polishing gas comprises halogen e.g. $Cl_2$:

$$5Cl_2(g) + 2Ta(s) \rightarrow 2TaCl_5(g)$$

gaseous reaction product to be removed is $TaCl_5$. When the polishing gas comprises a hydrogenated halogen e.g. HCl the reaction is:

$$10HCl(g) + 2Ta(s) \rightarrow 2TaCl_5(g) + 5H_2(g)$$

gaseous reaction product to be removed is $TaCl_5$ and $H_2$. When the polishing gas comprises a metal halide corresponding to the metal in the metallic surface e.g. $TaCl_5$ the reaction is:

$$4TaCl_5(g) + Ta(s) \rightarrow 5TaCl_4(g)$$

the gaseous reaction product to be removed is $TaCl_4$. Similar reactions will appear when other metal compounds and/or halogens are used.

In an alternative embodiment of the method according to the invention the polishing is electro polishing. In a known manner the article to be polished is submerged in a liquid solution and polished by use of current.

In another alternative embodiment the polishing is mechanical polishing. In the alternative embodiments the completed member has to be removed from the CVD chamber to be polished. Optionally the completed member has to be replaced in the CVD chamber if further treatment by CVD is required.

Consequently in a preferred embodiment the completed member is subjected to further chemical vapour deposition with a reactant gas or precursor comprising a metal compound to be incorporated in the metal surface. The precursor for further chemical vapour deposition may comprise the same or a different metal compound as the prior used precursor. Thus it is possible to "design" a metallic surface with desired properties depending on the metal in the precursor.

Moreover the completed member may, if desired, be subjected to further polishing, which may improve the properties of the surface of the completed member.

According to the method the metallic surface deposited and polished comprises metals selected from the group consisting of Ta, Nb, Mo and W. The metals are present as metal compounds in the precursor and deposits on the surface of the substrate forming a metallic surface.

In an example where the precursor is tantalumpentachloride $TaCl_5$ and the reducing gas is hydrogen $H_2$, the depositing reaction may be the following:

$$2TaCl_5(g) + 5H_2(g) \rightarrow 2Ta(s) + 10HCl(g)$$

The resulting metallic layer on the substrate is tantalum Ta and the gaseous reaction product is hydrogen chloride HCl, which is removed from the CVD chamber. A similar reaction will appear in embodiments with other metal compounds being the precursor, e.g. $NbCl_5$, $MoCl_5$ or $WCl_5$.

Preferably the substrate is selected from the group consisting of titanium, copper, steel alloys, zirconium, ceramics, graphite, fibre reinforced graphite and any combination of those materials. Also alloys as vitallium® and similar alloys may be suitable. Such materials are able to tolerate the process conditions in the CVD process.

The method according to the invention provides a preferred embodiment, in which the metallic surface is diffusion tight. Thus the metallic surface may serve as a diffusion tight coating on the surface of the substrate. For instance if the substrate is vitallium®, a metallic surface of tantalum deposited according to the invention may act as a diffusion tight coating, and prevent e.g. cobalt from the substrate to diffuse from the vitallium® into the environment.

Moreover the method provides an embodiment in which the completed member is an implant and preferably a surgical implant. The implant may be formed from titanium or vitallium® as substrate and provided with a metallic surface of tantalum by the method according to the invention.

BRIEF DESCRIPTION OF THE DRAWINGS

The invention will now be described in further details with reference to a preferred embodiment and a drawing in which.

DETAILED DESCRIPTION OF THE PREFERRED EMBODIMENTS

Figure 1:
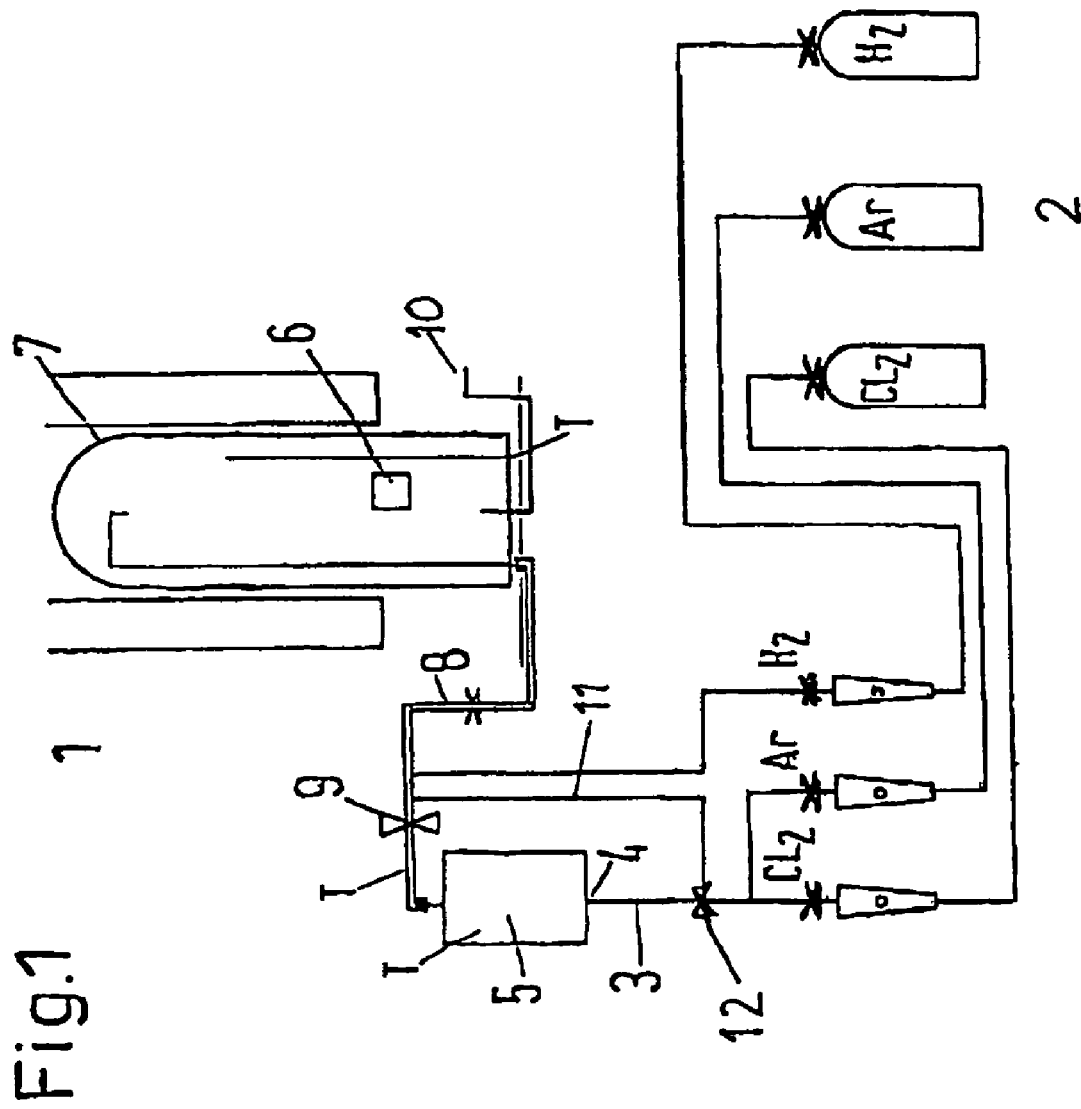
FIG. 1 shows an apparatus suitable for use in the method according to the invention.

FIG. 1 shows a sketch of an apparatus, which can be used for modifying metallic surfaces according to the invention.

The apparatus 1 comprises a gas supply part 2, in which the exemplified gases are chlorine, argon and hydrogen. The chlorine gas is used for preparing the precursor, e.g. tantalumpentachloride ($TaCl_5$) and as polishing gas. Argon is an inert carrier gas used to control the diffusion rate in the processes. Hydrogen serves as a reducing gas in the CVD process. When $TaCl_5$ serves as precursor the metallic surface deposited on the substrate will be tantalum.

During the CVD process chlorine and argon is led to the reactor 5 for in situ preparation of precursor. Chlorine and argon is lead to the entrance 4 of the reactor 5 via pipe 3 and valve 12. Subsequently the precursor is lead to the CVD chamber 7 via pipe 8 where a metallic surface is deposited on the substrate 6. The pipe 8 is equipped with a pressure gauge 9 for measuring pressure. During the CVD process hydrogen is lead to the CVD chamber via pipe 8. The gaseous reaction product leaves the CVD chamber 7 via pipe 10.

When the CVD process is interrupted the flow of chlorine, argon, hydrogen and precursor to the CVD chamber are cut off by closing valves.

During the interruption polishing of the deposited metallic surface on the substrate 6 by chlorine gas is possible by guiding chlorine gas to the CVD chamber 7 via valve 12 and pipes 11 and 8. As for the CVD process gaseous reaction product leaves the CVD chamber 7 via pipe 10.

By the disclosed preferred embodiment it is possible to obtain CVD and polishing as an integrated process in one process equipment.

The apparatus 1 is equipped with temperature sensors T. Additionally the apparatus 1 may be equipped with valves, pressure gauges, pumps, filtration devices etc., which are not shown on the sketch, but are common on CVD apparatuses and well known by the skilled person.

Figure 2:
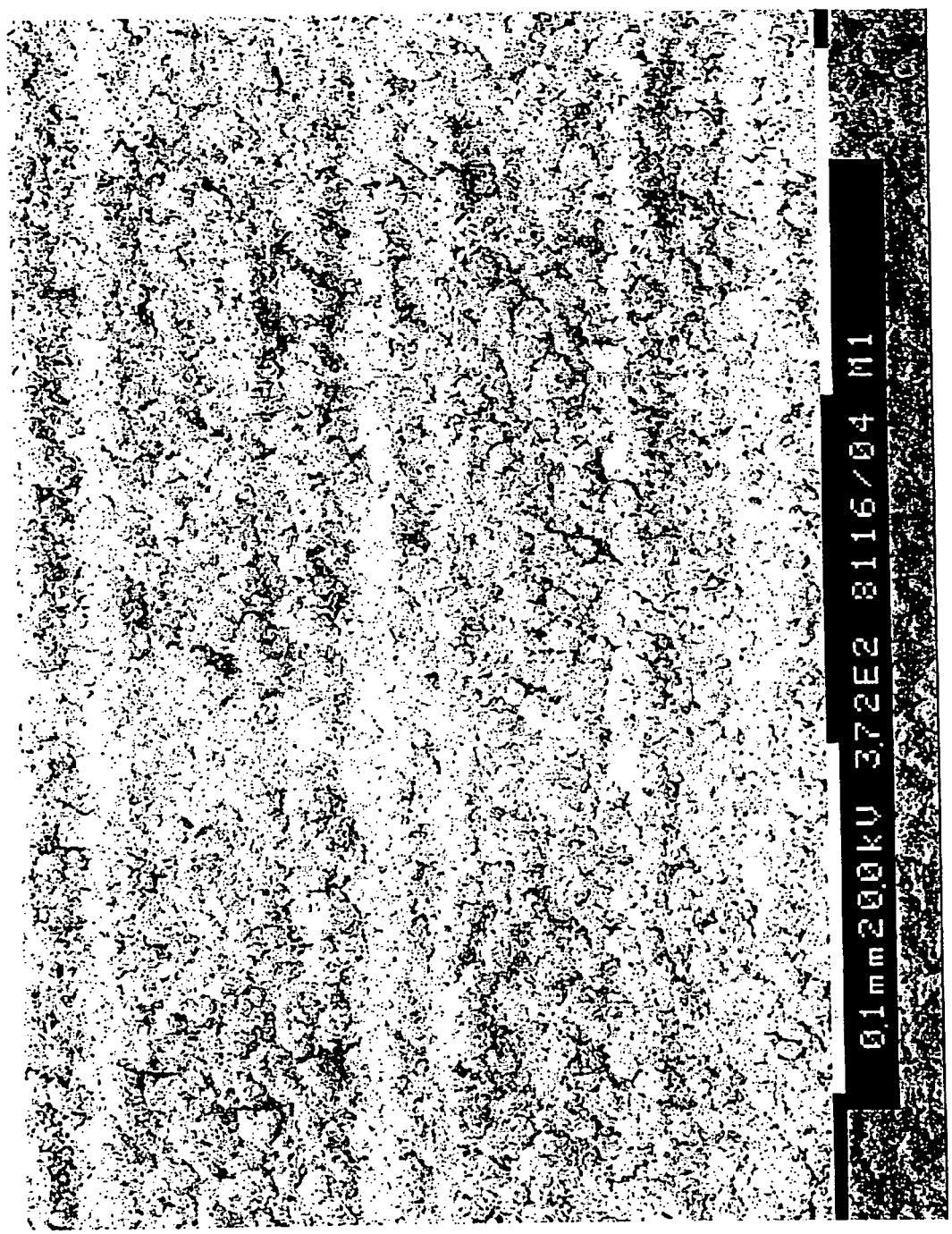
FIG. 2 shows a metallic surface of tantalum deposited by CVD before polishing.

FIG. 2 shows a SEM photography of a metallic surface of tantalum deposited by CVD on a substrate of stainless steel. The process was carried out in a 12 liter CVD chamber with $TaCl_5$ as precursor and argon as carrier gas and hydrogen as reducing gas. The flow of $TaCl_5$ was 0.05 mol/h*l, the flow of argon was 6 mol/h*l, and the flow of hydrogen was 2 mol/l*h.

The pressure was 20 mbar and the temperature 900° C. The CVD process was maintained for 90 minutes. The resulting layer of deposited tantalum is seen on FIG. 2. The layer had an average thickness of about 20 μm and appeared with a nodular and uneven surface.

Subsequently two samples were cut from the member shown in FIG. 2. The samples were subjected to the following treatments.

The fist sample was placed in the CVD chamber and the pressure was reduced to 100 mbar and the temperature was raised to 900° C. The sample was then subjected to a flow of chlorine gas of 0.3 mol/h*l and a flow of argon 60 mol/h*l for a period of 4 minutes. Approximately 0.004 g/cm$^3$ of tantalum was removed by the polishing from the sample surface. After the treatment the sample was removed from the CVD chamber and the SEM photography as shown in FIG. 3 was taken of the resulting surface.

The second sample was in a similar manner placed in the CVD chamber and the pressure was reduced to 100 mbar and the temperature was raised to 900° C. The sample was then subjected to a flow of chlorine gas of 0.1 mol/h*l and a flow of argon 60 mol/h*l for a period of 7 minutes. Approximately 0.006 g/cm$^3$ of tantalum was removed by the polishing from the sample surface. After the treatment the sample was removed from the CVD chamber and the SEM photography as shown in FIG. 4 was taken of the resulting surface.

Figure 3:
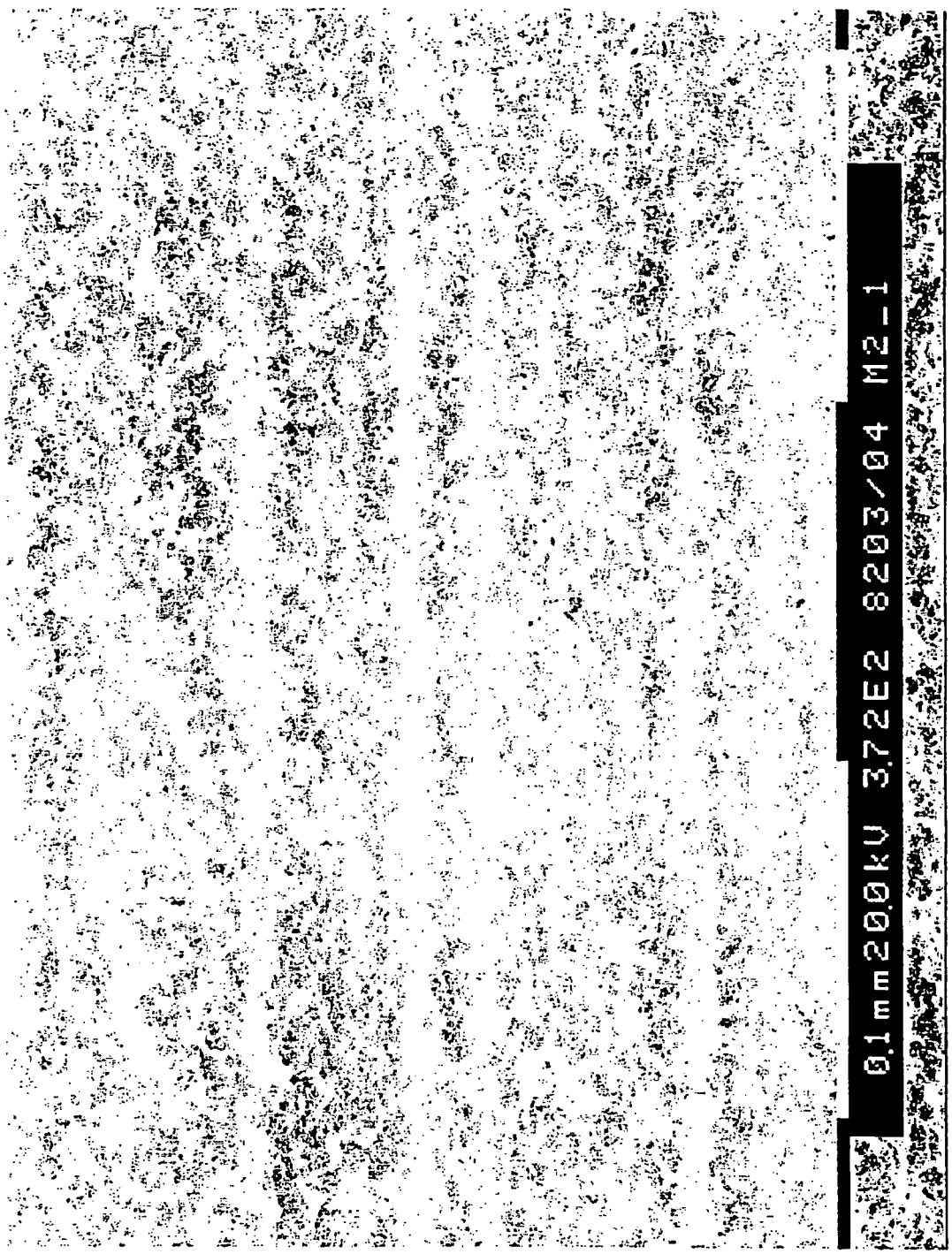
FIG. 3 shows the metallic surface of tantalum after polishing.
Figure 4:
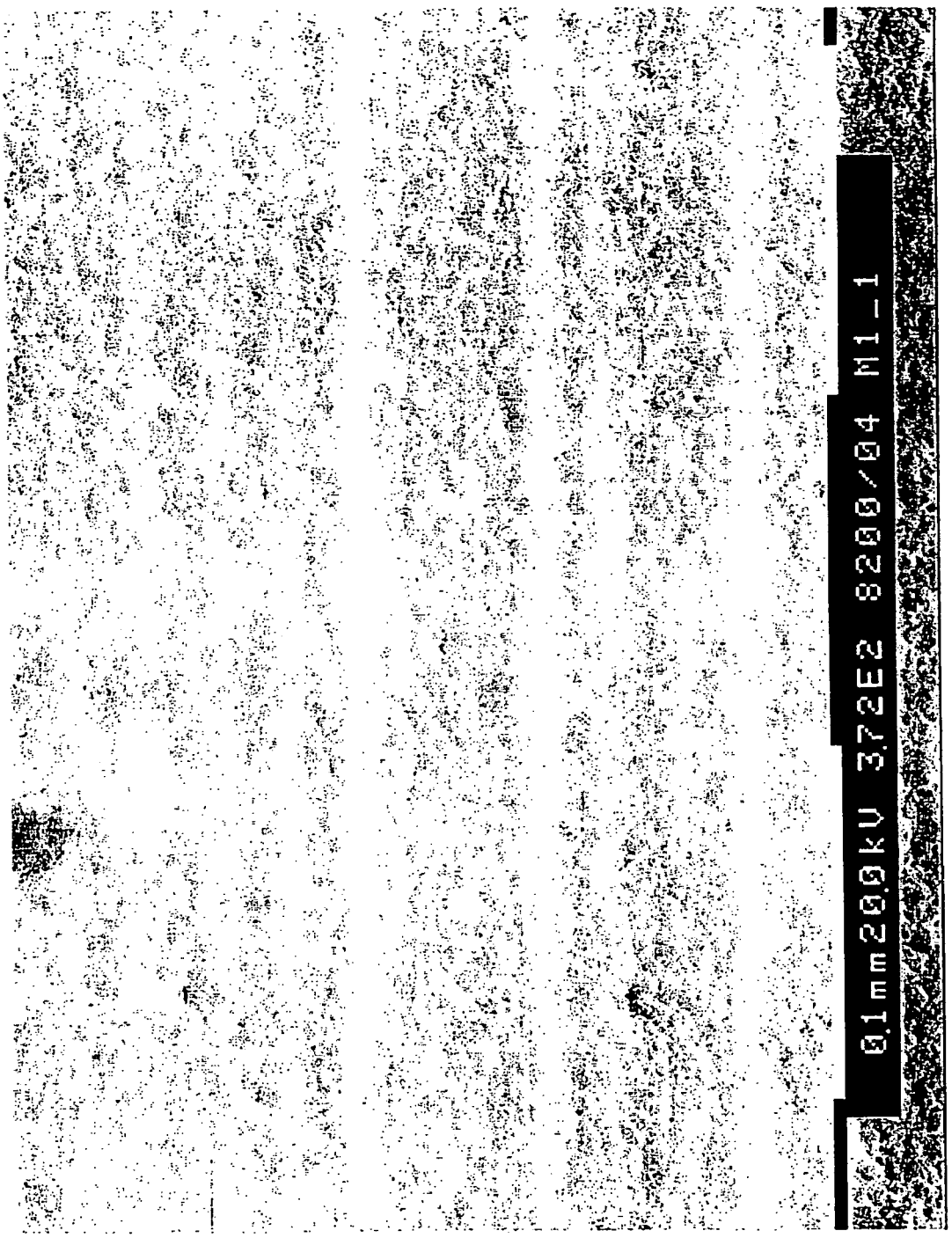
FIG. 4 shows the metallic surface of tantalum after polishing.

When comparing to the SEM photos of FIGS. 2, 3 and 4 it can clearly be seen that the surfaces of the first sample (FIG. 3) and second sample (FIG. 4) appears with a much smoother and even surface, than the surface, which has not been polished (FIG. 2).

The invention provides the possibility of operating a CVD process and polishing process as an interacting continuous process.

According to the invention a CVD process may start running in the CVD chamber providing a substrate with a metallic layer. The CVD process may then be interrupted after a predetermined time and during the interruption a polishing gas may be lead to the chamber to polish the metallic layer. The CVD process may then be continued and interrupted again. The cycles of the CVD process and interruption with gas polishing may be repeated several times until a satisfactory metallic layer is obtained on the substrate.

Optionally the CVD process may run for approximately 5 minutes before interruption. The interruption may last for about 30 seconds, before the CVD process is continued for another 5 minutes. The number of cycles may be 10 to 20 and the duration of the interruptions may be varied. For instance there may be a few longer interruptions or several shorter interruptions. Preferably the periods of chemical vapour deposition are longer than the periods of the interruptions and/or polishing. In particular the periods of polishing should be kept as short as possible to avoid removal of to much material of the metallic layer.

The invention claimed is:

1. A method for modifying a metallic surface, the method comprising chemical vapour deposition on a substrate in a chamber adapted for CVD involving the steps of:
   i) subjecting the substrate to chemical vapour deposition with a flow of reactant gas comprising a metal compound to be incorporated in the metallic surface;
   ii) interrupting the chemical vapour deposition by cutting off the flow of reactant gas; and
   iii) repeating steps (i) and (ii) at least once, so that the substrate and the metallic surface form a part of a completed member and said member during the interruption is subjected to a polishing of the metallic surface after depositing a part of the metal compound.

2. The method according to claim 1 wherein the deposition is interrupted for a predetermined time of at least 15 seconds.

3. The method according to claim 2 wherein the predetermined time is between 30 and 600 seconds.

4. The method according to claim 1 wherein the pressure in the chamber is reduced to be between 0.01 to 0.5 bar.

5. The method according to claim 1 wherein the temperature is between about 400° C. and about 1250° C.

6. The method according to claim 1 wherein the temperature is between about 500° C. and about 1100° C.

7. The method according to claim 1 wherein the temperature is between about 700° C. and about 1000° C.

8. The method according to claim 1 wherein the polishing is by a polishing gas.

9. The method according to claim 8 wherein the polishing gas includes a flow of reactive gas comprising halogen or hydrogen halide.

10. The method according to claim 9 wherein the halogen or hydrogen halide in the reactive gas is selected from the group consisting of $F_2$, $Cl_2$, $Br_2$, $I_2$, HF, HCl, HBr and HI.

11. The method according to claim 8 wherein the polishing gas comprises a metal halide.

12. The method according to claim 8 wherein the polishing gas further comprises at least one of argon, hydrogen, helium and nitrogen.

13. The method according to claim 12 wherein the flow of argon, hydrogen, helium or nitrogen is between 0.02 to 200 mol/h per liter reaction volume of the chamber.

14. The method according to claim 8 wherein the flow of polishing gas is between 0.01 to 1.0 mol/h per liter reaction volume of the chamber.

15. The method according to claim 8 wherein a gaseous reaction product is removed from the chamber.

16. The method according to claim 1 wherein the polishing is electro polishing.

17. The method according to claim 1 wherein the completed member is subjected to further chemical vapour deposition with a reactant gas comprising a metal compound to be incorporated in the metal surface.

18. The method according to claim 17 wherein the completed member is subjected to further polishing.

19. The method according to claim 1 wherein the metallic surface comprises metals selected from the group consisting of Ta, Nb, Mo and W.

20. The method according to claim 1 wherein the substrate is selected from the group consisting of titanium, copper, steel alloys, stainless steel, vitallium®, zirconium, ceramics, graphite, fibre reinforced graphite and any combination of those materials.

21. The A method according to claim 1 wherein the metallic surface is diffusion tight.

22. The method according to claim 1 wherein the completed member is a surgical implant.

23. A method for modifying a metallic surface, the method comprising chemical vapour deposition on a substrate in a chamber adapted for CVD comprising the steps of:
   i) subjecting the substrate to chemical vapour deposition with a flow of reactant gas comprising a metal compound to be incorporated in the metal surface;
   ii) interrupting the chemical vapour deposition by cutting off the flow of reactant gas; and
   iii) repeating steps (i) and (ii) at least once, so that the substrate and the metallic surface form a part of a completed member and said member during the interruption is subjected to a polishing of the metallic surface after depositing a part of the metal compound, the polishing being by a reactive gas comprising halogen.

24. The method according to claim 23 wherein the halogen in the reactive gas is selected from the group consisting of $F_2$, $Cl_2$, $Br_2$, and $I_2$.

* * * * *